United States Patent
Kim et al.

(10) Patent No.: US 10,236,464 B2
(45) Date of Patent: Mar. 19, 2019

(54) ORGANIC LIGHT EMITTING DIODE

(71) Applicant: SAMSUNG DISPLAY CO., LTD., Yongin, Gyeonggi-Do (KR)

(72) Inventors: Dong Chan Kim, Gunpo-si (KR); Won Jong Kim, Suwon-si (KR); Eung Do Kim, Seoul (KR); Dong Kyu Seo, Hwaseong-si (KR); Da Hea Im, Incheon (KR); Sang Hoon Yim, Suwon-si (KR); Chang Woong Chu, Hwaseong-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 399 days.

(21) Appl. No.: 14/821,983

(22) Filed: Aug. 10, 2015

(65) Prior Publication Data

US 2016/0056400 A1 Feb. 25, 2016

Related U.S. Application Data

(63) Continuation-in-part of application No. 14/735,582, filed on Jun. 10, 2015.

(30) Foreign Application Priority Data

Aug. 21, 2014 (KR) .................. 10-2014-0109197
Jul. 14, 2015 (KR) .................. 10-2015-0099984

(51) Int. Cl.
*H01L 51/54* (2006.01)
*H01L 51/50* (2006.01)
*H01L 51/52* (2006.01)

(52) U.S. Cl.
CPC ........ *H01L 51/504* (2013.01); *H01L 51/5092* (2013.01); *H01L 51/5221* (2013.01); *H01L 51/5265* (2013.01)

(58) Field of Classification Search
CPC ............. H01L 51/0032; H01L 51/0059; H01L 51/0061; H01L 51/0051; H01L 51/0071; H01L 51/0072; H01L 51/0073; H01L 51/0074; H01L 51/50; H01L 51/5012; H01L 51/5016; H01L 51/5048; H01L 51/5056; H01L 51/5072; H01L 51/5076; H01L 51/5088; H01L 51/5092; H01L 51/52; H01L 51/5203; H01L 51/5036; H01L 51/504; H01L 51/5018; H01L 51/5221; H01L 51/5234; H01L 51/5262; H01L 51/5265; H01L 2251/00; H01L 2251/30; H01L 2251/301; H01L 2251/303; H01L 2251/55; H01L 2251/558
USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

U.S. PATENT DOCUMENTS

| | | | |
|---|---|---|---|
| 5,677,572 A | 10/1997 | Hung et al. | |
| 6,416,888 B1 | 7/2002 | Kawamura et al. | |
| 7,868,536 B2 | 1/2011 | Aurongzeb | |
| 2005/0274961 A1* | 12/2005 | Iou ...................... | H01L 51/5052 257/82 |
| 2006/0273712 A1* | 12/2006 | Yaegashi ............. | H01L 27/3276 313/503 |
| 2007/0007882 A1* | 1/2007 | Fukuoka ............. | H01L 51/0051 313/503 |
| 2010/0148158 A1 | 6/2010 | Kim et al. | |
| 2012/0148158 A1 | 6/2012 | DeSpain | |
| 2012/0223633 A1 | 9/2012 | Yoshinaga et al. | |
| 2012/0299037 A1* | 11/2012 | Lee ...................... | H01L 51/5206 257/98 |
| 2013/0313527 A1 | 11/2013 | Kim | |
| 2014/0191209 A1 | 7/2014 | Han et al. | |
| 2015/0194633 A1 | 7/2015 | Lee et al. | |
| 2015/0200379 A1 | 7/2015 | Kim | |
| 2016/0035979 A1 | 2/2016 | Lee et al. | |

FOREIGN PATENT DOCUMENTS

| | | |
|---|---|---|
| CN | 102655164 A | 9/2012 |
| JP | 2005-251587 A | 9/2005 |
| JP | 2009-044104 A | 2/2009 |
| KR | 10-2012-0042473 A | 5/2012 |
| KR | 10-2012-0054453 A | 5/2012 |
| KR | 10-1182447 B1 | 9/2012 |
| TW | 200917893 A | 4/2009 |
| TW | 201133977 A | 10/2011 |

OTHER PUBLICATIONS

Wang, et al., "Enhancement of Electron Injection in Organic Light-Emitting Devices Using an Ag/LiF Cathode," Journal of Applied Physics 95, (2004), 3828-3830.
U.S. Office action in corresponding parent U.S. Appl. No. 14/735,582; Kim et al.
Provisional double patenting rejection over claims of the corresponding parent U.S. Appl. No. 14/735,582; USPTO Office action dated Jul. 10, 2017, in U.S. Appl. No. 14/731,729.
Chinese Office action dated Nov. 30, 2017 for corresponding Chinese Patent Application No. 201510514649.X.
Chinese Office action dated Nov. 30, 2017 for co-pending Chinese Patent Application No. 201510508265.7.
Provisional double patenting rejection over claims of the above-identified application; USPTO Office action dated May 16, 2018, in U.S. Appl. No. 14/736,663.
U.S. Office Action Made Final dated Dec. 6, 2017 in corresponding parent U.S. Appl. No. 14/735,582; Kim et al.

* cited by examiner

*Primary Examiner* — Andrew K Bohaty
(74) *Attorney, Agent, or Firm* — Lee & Morse, P.C.

(57) ABSTRACT

An organic light emitting diode, including a first electrode; a second electrode facing the first electrode, the second electrode including magnesium; an emission layer between the first electrode and the second electrode; and an electron injection layer between the second electrode and the emission layer, the electron injection layer including a dipole material including a first component and a second component having different polarities, the dipole material including halide, and a content of the magnesium included in the second electrode being in a range of from 10 to 40 volume %.

17 Claims, 11 Drawing Sheets

ORGANIC LIGHT EMITTING DIODE

CROSS-REFERENCE TO RELATED APPLICATIONS

This application is a continuation-in-part of pending U.S. application Ser. No. 14/735,582, entitled "Organic Light Emitting Diode," which was filed on Jun. 10, 2015, the entire contents of which are hereby incorporated by reference.

Korean Patent Application No. 10-2014-0109197, filed on Aug. 21, 2014, in the Korean Intellectual Property Office, and entitled: "Organic Light Emitting Diode and Organic Light Emitting Display Device Including the Same," and Korean Patent Application No. 10-2015-0099984, filed on Jul. 14, 2015, in the Korean Intellectual Property Office, and entitled: "Organic Light Emitting Diode," are incorporated by reference herein in their entirety.

BACKGROUND

1. Field

Provided are an organic light emitting diode and an organic light emitting display device including the same.

2. Description of the Related Art

Lightweight and thin personal computers and televisions sets may require lightweight and thin display devices, and flat panel displays satisfying such requirements may be substituted for cathode ray tubes (CRTs). A liquid-crystal display (LCD) is a passive display device, an additional backlight as a light source is needed, and an LCD may exhibit a slow response time and a narrow viewing angle.

SUMMARY

Embodiments may be realized by providing an organic light emitting diode, including a first electrode; a second electrode facing the first electrode, the second electrode including magnesium; an emission layer between the first electrode and the second electrode; and an electron injection layer between the second electrode and the emission layer, the electron injection layer including a dipole material including a first component and a second component having different polarities, the dipole material including halide, and a content of the magnesium included in the second electrode being in a range of from 10 to 40 volume %.

The second electrode may include silver (Ag)-magnesium (Mg), and a thickness of the second electrode may be in a range of from 50 to 150 Å.

The first component may include one or more of an alkali metal, an alkaline earth metal, a rare earth metal, or a transition metal.

The dipole material may include one or more of LiI, NaI, KI, RbI, CsI, or FrI.

The electron injection layer may further include a metal having a work function of 4.0 eV or less, and the metal may include one or more of Li, Na, K, Rb, Cs, Ca, Sr, Ba, Ce, Sm, Eu, Gd, La, Nd, Tb, Lu, Mg, Yb, or an alloy thereof.

The electron injecting layer may include a dipole material including iodine (I) and ytterbium (Yb).

The electron injection layer may be formed by co-depositing a dipole material including one of LiI, NaI, KI, RbI, CsI, FrI, and ytterbium (Yb).

The electron injection layer may further include an oxide having relative permittivity of 10 or more, and the electron injection layer may be formed by co-depositing two or more of the dipole material, the metal having the work function of 4.0 eV or less, and the oxide having relative permittivity of 10 or more.

The organic light emitting diode may further include an electron transport layer between the emission layer and the electron injection layer; and a hole transport layer between the emission layer and the first electrode. Each of the hole transport layer and the electron transport layer may include an organic material.

The emission layer may include a red light emitting layer, a green light emitting layer, and a blue light emitting layer, and the emission layer may further include an auxiliary layer at a lower end of the blue light emitting layer.

The organic light emitting diode may further include a red resonance auxiliary layer at a lower end of the red light emitting layer, and a green resonance auxiliary layer at a lower end layer of the green light emission layer.

The auxiliary layer may include a compound represented by Chemical Formula 1:

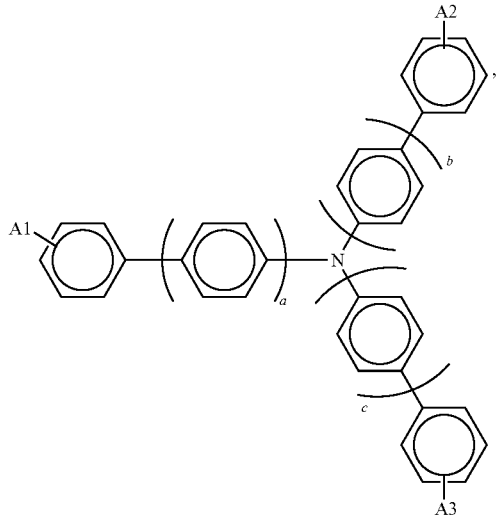

wherein each of "A1," "A2," and "A3" is an alkyl group, an aryl group, carbazole, dibenzothiophene, dibenzofuran (DBF), or biphenyl, and each of "a," "b," and "c" is an integer in a range of from 0 and 4.

The auxiliary layer may include a compound represented by Chemical Formula 2:

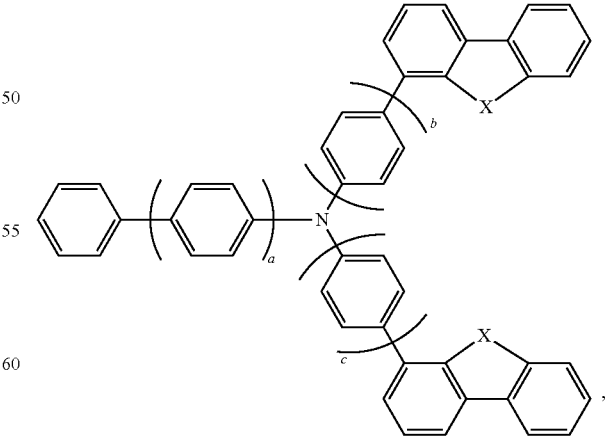

wherein each of "a," "b," and "c" is an integer in a range of from 0 to 3, "X" is selected from O, N, and S, and the elements selected for X are the same as or different from each other.

Embodiments may be realized by providing an organic light emitting diode, including a first electrode; a second electrode facing the first electrode; an emission layer between the first electrode and the second electrode; a hole transport region between the first electrode and the second electrode; and an electron injection layer between the second electrode and the emission layer, the electron injection layer including a dipole material including a first component and a second component having different polarities, and the hole transport region including a doping layer including a charge generating material.

The doping layer may be adjacent to an interface between the first electrode and the hole transport region.

The charge generating material may include a p-dopant.

The p-dopant may include one or more of a quinon derivative, a metal oxide, or a cyano group-containing compound.

The hole transport region may include one or more of a hole injection layer or a hole transport layer, and a content of the p-dopant included in the doping layer may be in a range of 4 volume % or less.

The dipole material may include halide, and the second electrode may include silver-magnesium.

A content of magnesium included in the second electrode may be in a range of from 10 to 40 volume %.

The dipole material may include one more of LiI, NaI, KI, RbI, CsI, or FrI.

The electron injection layer may further include a metal having a work function of 4.0 eV or less, and the metal may include one or more of Li, Na, K, Rb, Cs, Ca, Sr, Ba, Ce, Sm, Eu, Gd, La, Nd, Tb, Lu, Mg, Yb, or an alloy thereof.

The electron injection layer may include a dipole material including iodine (I) and ytterbium (Yb)$_3$.

The electron injection layer may be formed by co-depositing a dipole material including one of LiI, NaI, KI, RbI, CsI, FrI, and ytterbium (Yb).

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
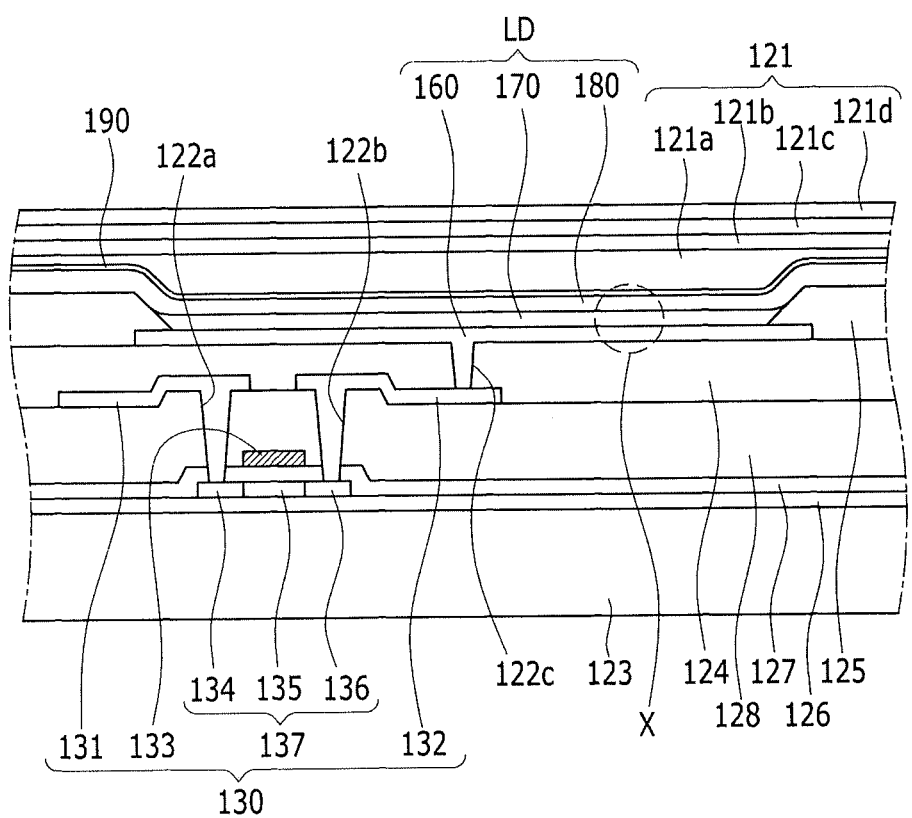
FIG. 1 illustrates a cross-sectional view of an organic light emitting display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the thickness and dimensions of layers, films, panels, regions, etc., may be exaggerated for clarity. It will be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals designate like elements throughout the specification.

Figure 2:
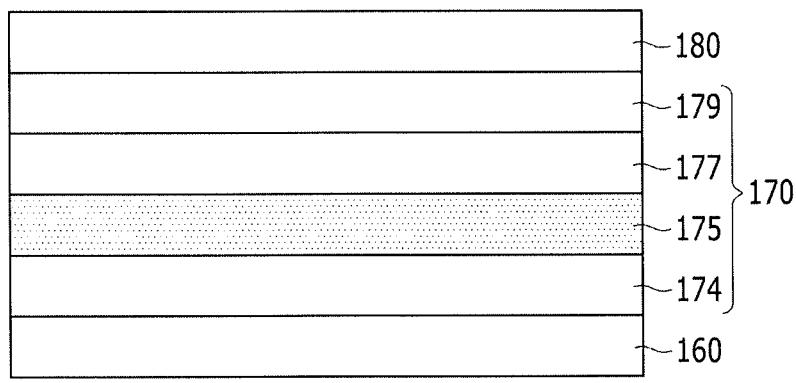
FIG. 2 illustrates an enlarged cross-sectional view of the organic light emitting diode shown in FIG. 1.

FIG. 1 illustrates a cross-sectional view of an organic light emitting display device according to an exemplary embodiment. FIG. 2 illustrates an enlarged cross-sectional view of the organic light emitting diode as shown in FIG. 1.

Referring to FIG. 1 and FIG. 2, the organic light emitting display device according to the exemplary embodiment may include a substrate 123, a driving thin film transistor 130, a first electrode 160, a light-emitting element layer 170, and a second electrode 180. The first electrode 160 and the second electrode 180 may respectively be an anode and a cathode, or vice versa.

The substrate 123 may be made of, e.g., an inorganic material such as glass, an organic material such as polycarbonate (PC), polymethylmethacrylate (PMMA), polyethylene terephthalate (PET), polyamide (PA), polyethersulfone (PES), or a combination thereof, or a silicon wafer.

A substrate buffer layer 126 may be formed on the substrate 123. The substrate buffer layer 126 may prevent penetration of impurities and planarize the surface.

The substrate buffer layer 126 may be made of various materials capable of performing the functions. For example, one of a silicon nitride (SiNx) layer, a silicon oxide (SiOx) layer, and a silicon oxynitride (SiOxNy) layer may be used as the substrate buffer layer 126. In an embodiment, the substrate buffer layer 126 may be omitted according to a kind of substrate 123 and a process condition.

A driving semiconductor layer 137 may be formed on the substrate buffer layer 126. The driving semiconductor layer 137 may be formed of a material including polysilicon. The driving semiconductor layer 137 may include a channel region 135 in which impurities (dopants) are not doped, and a source region 134 and a drain region 136 in which the impurities are doped at respective sides of the channel region 135. The doped ion materials may be P-type impurities such as boron (B), for example, $B_2H_6$. The impurities vary according to a kind of thin film transistor.

A gate insulating layer 127 made of a silicon nitride (SiNx) or silicon oxide (SiOx) may be formed on the driving semiconductor layer 137. A gate wire including a driving gate electrode 133 may be formed on the gate insulating layer 127. The driving gate electrode 133 may be formed to overlap at least a part of the driving semiconductor layer 137, for example, the channel region 135.

An interlayer insulating layer 128 covering the driving gate electrode 133 may be formed on the gate insulating layer 127. A first contact hole 122a and a second contact hole 122b exposing the source region 134 and the drain region 136 of the driving semiconductor layer 137 are respectively formed in the gate insulating layer 127 and the interlayer insulating layer 128. The interlayer insulating layer 128 may be formed by using a material such as a silicon nitride (SiNx) or a silicon oxide (SiOx), like the gate insulating layer 127.

A data wire including a driving source electrode 131 and a driving drain electrode 132 may be formed on the interlayer insulating layer 128. The driving source electrode 131 and the driving drain electrode 132 may be connected with the source region 134 and the drain region 136 of the driving semiconductor layer 137 through the first contact hole 122a and the second contact hole 122b formed in the interlayer insulating layer 128 and the gate insulating layer 127, respectively.

The driving thin film transistor 130 including the driving semiconductor layer 137, the driving gate electrode 133, the driving source electrode 131, and the driving drain electrode 132 may be formed. The configuration of the driving thin film transistor 130 may be variously modified.

A planarization layer 124 covering the data wire may be formed on the interlayer insulating layer 128. The planarization layer 124 may remove and planarize a step, and may increase emission efficiency of the organic light emitting element to be formed thereon. The planarization layer 124 may have a third contact hole 122c exposing a part of the drain electrode 132.

The planarization layer 124 may be made of one or more materials of a polyacrylate resin, an epoxy resin, a phenolic resin, a polyamide resin, a polyimide resin, an unsaturated polyester resin, a polyphenylene ether resin, a polyphenylene sulfide resin, or benzocyclobutene (BCB).

In an embodiment, one of the planarization layer 124 and the interlayer insulating layer 128 may be omitted.

A first electrode of the organic light emitting element, for example, a pixel electrode 160, may be formed on the planarization layer 124. For example, the organic light emitting diode device may include a plurality of pixel electrodes 160 which may be disposed for every plurality of pixels, respectively. The pixel electrodes 160 may be spaced apart from each other. The pixel electrode 160 may be connected to the drain electrode 132 through the third contact hole 122c of the planarization layer 124.

A pixel defining layer 125 having an opening exposing the pixel electrode 160 may be disposed on the planarization layer 124. For example, a plurality of openings respectively corresponding to the pixels may be formed between pixel defining layers 125. The light-emitting element layer 170 may be formed for each opening formed by the pixel defining layer 125. Accordingly, a pixel area in which each light-emitting element layer 170 may be formed by the pixel defining layer 125 may be defined.

The pixel electrode 160 may be disposed to correspond to the opening of the pixel defining layer 125. In an embodiment, the pixel electrode 160 is not disposed only in the opening of the pixel defining layer 125, but may be disposed below the pixel defining layer 125 so that a part of the pixel electrode 160 overlaps with the pixel defining layer 125.

The pixel defining layer 125 may be made of, for example, resin such as a polyacrylate resin and a polyimide, or a silica-based inorganic material.

The light-emitting element layer 170 may be formed on the pixel electrode 160. A structure of the light-emitting element layer 170 will be described below in detail.

The second electrode, for example, a common electrode 180, may be formed on the light-emitting element layer 170. The organic light emitting diode LD including the pixel electrode 160, the light-emitting element layer 170, and the common electrode 180 may be formed.

Each of the pixel electrode 160 and the common electrode 180 may be made of a transparent conductive material or a transflective or reflective conductive material. According to kinds of materials forming the pixel electrode 160 and the common electrode 180, the organic light emitting diode device may be a top emission type, a bottom emission type, or a double-sided emission type.

An overcoat 190 covering and protecting the common electrode 180 may be formed as an organic layer on the common electrode 180.

A thin film encapsulation layer 121 may be formed on the overcoat 190. The thin film encapsulation layer 121 may encapsulate and protect the organic light emitting element LD and a driving circuit part formed on the substrate 123 from the external environment.

The thin film encapsulation layer 121 may include organic encapsulation layers 121a and 121c and inorganic encapsulation layers 121b and 121d which may be alternately laminated. In FIG. 1, as an example, two organic encapsulation layers 121a and 121c and two inorganic encapsulation layers 121b and 121d may be alternately laminated to configure the thin film encapsulation layer 121.

Hereinafter, an organic light emitting diode according to an exemplary embodiment will be described with reference to FIG. 2.

Referring to FIG. 2, the organic light emitting diode according to the present exemplary embodiment (i.e., a part X shown in FIG. 1) may include a structure in which a first electrode 160, a hole transport layer 174, an emission layer 175, an electron transport layer 177, an electron injection layer 179, and a second electrode 180 may be sequentially stacked.

The first electrode 160 may be the anode, may be made of a material selected from materials having high work functions, and the hole injection may be made easier. The first electrode 160 may include a transparent electrode and/or a non-transparent electrode. The first electrode 160 may be the transparent electrode, and may be formed to have a thin thickness by using a conductive oxide such as indium tin oxide (ITO), indium zinc oxide (IZO), tin oxide ($SnO_2$), zinc oxide (ZnO), or a combination thereof, or a metal such as aluminum, silver, and magnesium. The first electrode 160 may be a non-transparent electrode, and may be formed by using a metal such as aluminum, silver and magnesium.

The first electrode 160 may be formed to have a structure of two or more layers including different materials. For example, the first electrode 160 may be formed to have a structure in which indium tin oxide (ITO), silver (Ag), and indium tin oxide (ITO) may be sequentially stacked.

The first electrode 160 may be formed by using, for example, a sputtering method or a vacuum deposition method.

A hole transport region may be positioned on the first electrode 160. The hole transport region may include an auxiliary layer disposed between the first electrode and the emission layer 175. The hole transport region may include at least one of a hole transport layer and a hole injection layer. A structure in which the hole transport layer 174 is formed in the hole transport region is illustrated in the exemplary embodiment of FIG. 2. The hole transport layer 174 may facilitate smooth transport of the holes transferred from the first electrode 160. The hole transport layer 174 may include an organic material. For example, the hole transport layer 174 may be formed of N,N-di(1-naphthyl)-N,N'-di(phenyl) benzidine (NPD), N,N'-bis(3-methylphenyl)-N,N'-bis(phenyl) (TPD), s-TAD, or 4,4',4"-tris(N-3-methylphenyl-N-phenyl-amino)-triphenylamine (MTDATA).

The thickness of the hole transport layer 174 may be in a range of from 15 nm to 25 nm. For example, the thickness of the hole transport layer 174 may be 20 nm. The emission layer 175 may be disposed on the hole transport layer 174. The emission layer 175 may contain a light emitting material for displaying a predetermined color. For example, the emission layer 175 may display a primary color such as blue, green, or red, or a combination thereof.

The thickness of the emission layer 175 may be in a range of from 10 nm to 50 nm. The emission layer 175 may contain a host and a dopant. The emission layer 175 may contain materials for emitting red, green, blue, and white light, and may be formed by using a phosphorescent or a fluorescent material.

The emission layer 175 may emit red light, may contain a host material including carbazole biphenyl (CBP) or 1,3-bis(carbazol-9-yl) (mCP), and may be formed of a phosphorescent material containing a dopant including one or more of, for example, PIQIr(acac) (bis(1-phenylisoquinoline)acetylacetonate iridium), PQIr(acac) (bis(1-phenylquinoline)acetylacetonate iridium), PQIr (tris(1-phenylquinoline)iridium), or PtOEP (platinum octaethylporphyrin).

The emission layer 175 may emit green light, may contain a host material including CBP or mCP, and may be formed of a phosphorescent material containing a dopant including Ir(ppy)3(fac-tris(2-phenylpyridine)iridium) or a phosphorescent material containing a dopant including Alq3(tris(8-hydroxyquinolino)aluminum).

The emission layer 175 may emit green light, may contain a host material including CBP or mCP, and may be formed of a phosphorescent material containing a dopant (4,6-F2ppy)2Irpic. The emission layer 175 may be formed of a phosphorescent material containing one or more of spiro-DPVBi, spiro-6P, distyryl benzene (DSB), distyryl arylene (DSA), a PFO-based polymer, or a PPV-based polymer.

An electron transport region may be positioned between the emission layer 175 and the second electrode 180. The electron transport region may include an auxiliary layer disposed between the emission layer 175 and the second electrode 180. A structure in which the electron transport layer 177 and the electron injection layer 179 are formed in the electron transport region is illustrated in the exemplary embodiment of FIG. 2.

The electron transport layer 177 may be disposed on the emission layer 175. The electron transport layer 177 may facilitate transfer of electrons from the second electrode 180 to the emission layer 175. The electron transport layer 177 may help prevent the holes injected from the first electrode 160 from moving to the second electrode 180 through the emission layer 175. The electron transport layer 177 may serve as a hole blocking layer, and may improve combination of the holes and electrons in the emission layer 175.

The electron transport layer 177 may include an organic material. For example, the electron transport layer 177 may be formed of one or more of Alq3(tris(8-hydroxyquinolino) aluminum), PBD, TAZ, spiro-PBD(2-[4-biphenyl-5-[4-tert-butylphenyl]]-1,3,4-oxadiazole), TAZ(1,2,4-triazole), spiro-PBD(spiro-2-[4-biphenyl-5-[4-tert-butylphenyl]]-1,3,4-oxadiazole), or BAlq(8-hydroxyquinoline beryllium salt).

The electron injection layer 179 may be disposed on the electron transport layer 177. The electron injection layer 179 may improve electron injection from the second electrode 180 to the electron transport layer 177. In the present exemplary embodiment, the electron injection layer 179 may include a dipole material formed by coupling a first component and a second component having different polarities. The first component may be an element which may be changed to a positive ion when the dipole material is ionized, and the second component may be an element which may be changed to a negative ion. In the present exemplary embodiment, the thickness of the electron injection layer 179 may be in a range of from about 2 Å to 25 Å.

The dipole material may have a dipole moment that is higher than that of LiF. For example, the dipole moment of LiF may be 6.28 Debye, and, in the present exemplary embodiment, the dipole moment of the dipole material may be higher than 6.28 Debye. Referring to the periodic table, the first component of the dipole material may include one or more of an alkali metal, an alkaline earth metal, a rare earth metal, or a transition metal, and the second component may include a halogen. For example, the first component may include one or more of Li, Na, K, Rb, Cs, Fr, Be, Mg, Ca, Sr, or Ba, the second component may include one or more of F, Cl, Br, or I, and the dipole material may include one or more of LiI, NaI, KI, RbI, CsI, or FrI.

The second electrode 180 may be disposed on the electron injection layer 179. When the second electrode 180 serves as the cathode, it may include a material having a small work function to make the electron injection easy. An example of the material having the small work function may include, for example, a metal such as magnesium, calcium, sodium, potassium, titanium, indium, yttrium, lithium, gadolinium, aluminum, silver, tin, lead, cesium, barium, or an alloy thereof, or a multi-layer structure substance such as LiF/Al, LiO$_2$/Al, LiF/Ca, LiF/Al, and BaF$_2$/Ca. The second electron 180 may include Li, Mg, Al, Al—Li, Ca, Ag, or Mg—Ag.

When the aforementioned second electrode 180 is made of an alloy, an alloy ratio may be controlled according to a temperature of a deposition source, an atmosphere, and a vacuum degree, and it may be selected to have an appropriate ratio value. In the present exemplary embodiment, the second electrode 180 may have a thickness that is in a range of from about 50 to 150 Å. If the thickness of the second electrode 180 is smaller than 50 Å, the difficulty lies in acquiring a surface resistance. If the thickness thereof is greater than 150 Å, the reflectivity may be increased, a wide angle distribution (WAD) may be deteriorated, and a color change in a side view may be caused.

In the present exemplary embodiment, the second electrode 180 may be made of AgMg, and the Mg content of the second electrode 180 may be in a range of from 10 to 40 volume %.

The second electrode 180 may be configured to have two or more layers.

The following Examples and Comparative Example are provided in order to highlight characteristics of one or more embodiments, but it will be understood that the Examples and Comparative Example are not to be construed as limiting the scope of the embodiments, nor is the Comparative Example to be construed as being outside the scope of the embodiments. Further, it will be understood that the embodiments are not limited to the particular details described in the Examples and Comparative Example.

Table 1 demonstrates the light efficiency when the electron injection layer is made of RbI and CsI according to an exemplary embodiment. In Table 1, Comparative Example 1 indicates a case in which the electron injection layer was Yb, and Examples 1 and 2 respectively indicate a first case in which the electron injection layer was made of RbI and a second case in which the electron injection layer was made of CsI. The second electrode corresponding to a cathode adjacent to the electron injection layer was AgMg, and the MG content of the negative electrode was about 25% in Examples 1 and 2. The unit of "%" is volume %. The electron injection layer was formed to have a thickness of about 10 Å in Examples 1 and 2.

TABLE 1

|  | R efficiency | G efficiency | B efficiency (CE/y) | W efficiency | Increment |
|---|---|---|---|---|---|
| Comparative Example 1 | 45.8 | 55.6 | 106.1 | 32.1 | Ref |
| Example 1 | 50.6 | 60.1 | 134.5 | 37.6 | 17.1% |
| Example 2 | 48.7 | 59.2 | 133.0 | 36.5 | 13.7% |

Referring to Table 1, Examples 1 and 2 respectively accomplished white efficiencies which were improved by 17.1% and 13.7% as compared with Comparative Example 1

Table 2 demonstrates the light efficiency of blue pixels when the electron injection layer is made of RbI and the negative electrode is made of AgMg according to an exemplary embodiment. In Table 2, Examples 3, 4, 5 and 6 indicate cases in which the MG content of a cathode was 10%, 20%, 30% and 40%, respectively. The unit of "%" is volume %. In Examples 3 to 6, the electron injection layer and the negative electrode were respectively formed to have a thickness of about 10 and 100 Å.

TABLE 2

|  | Mg content (volume %) | Driving voltage (V) | B efficiency (candela/ampere/year) |
|---|---|---|---|
| Example 3 | 10 | 4.2 | 134.5 |
| Example 4 | 20 | 4.1 | 153.3 |
| Example 5 | 30 | 4.0 | 144.6 |
| Example 6 | 40 | 4.0 | 142.0 |

Referring to Table 2, the Mg content may be considered an important factor when the negative electrode made of AgMg is formed on the electron injection layer made of RbI. For example, if the volume % of Mg is smaller than about 10 volume %, the film stability may deteriorate, and electron injection may be difficult. If the volume % is greater than about 40 volume %, the electron injection may be too quickly performed to maintain the balance with holes, and the light efficiency may be deteriorated. Accordingly, in the present exemplary embodiment, the Mg content of the second electrode included in the organic light emitting diode may be in a range of from 10 to 40 volume %.

In the organic light emitting diode LD according to the present exemplary embodiment, the electron injection layer 179 may include a metal having a work function of 4.0 eV or less and/or an oxide having relative permittivity of 10 or more in addition to the dipole material. The electron injection layer 179 may be formed by co-deposition of at least two of oxides each having relative permittivity of 10 or more and the metal having the work function of 4.0 eV or less.

In the present exemplary embodiment, examples of the metal having the work function of 4.0 eV or less may include one or more of Li, Na, K, Rb, Cs, Ca, Sr, Ba, Ce, Sm, Eu, Gd, La, Nd, Tb, Lu, Mg, Yb, or an alloy thereof. The electron injection layer 179 may be formed as a single layer by co-deposition of the metal having the work function of 4.0 eV or less and the dipole material. For example, the electron injection layer 179 may be formed by co-deposition of a dipole material including RbI and a metal including Yb.

Table 3 demonstrates the efficiency when the electron injection layer is formed by co-deposition of RbI doped with Yb according to an exemplary embodiment. In Comparative Example 1, the electron injection layer was made of Yb, and in Examples 7 and 8, the electron injection layer was made of RbI doped with Yb and CsI doped with Yb, respectively. A cathode that was disposed adjacent to the electron injection layer was made of AgMg, and the Mg content of the cathode in Examples 7 and 8 was 10 volume %. In Examples 7 and 8, the electron injection layer was formed to have a thickness of 10 Å.

TABLE 3

|  | R efficiency | G efficiency | B efficiency (CE/y) | W efficiency | Increment |
|---|---|---|---|---|---|
| Comparative Example 1 | 45.8 | 55.6 | 106.1 | 32.1 | Ref. |
| Example 7 | 61.3 | 105.3 | 155 | 50.4 | 57.0% |
| Example 8 | 55 | 102 | 150 | 48.7 | 51.7% |

Referring to Table 3, Examples 7 and 8 respectively accomplished white efficiencies which were improved by 57.0% and 51.7% as compared with Comparative Example 1.

In the present exemplary embodiment, examples of the oxide having relative permittivity of 10 or more may include one or more of $WO_3$, $MoO_3$, $Cu_2O$, $Yb_2O_3$, $Sm_2O_3$, $Nb_2O_3$, $Gd_2O_3$, or $Eu_2O_3$.

The organic light emitting diode LD according to an exemplary embodiment may accomplish smoother electron injection and strong resistance to an external oxide or moisture by selectively adding a combination of the metal having the work function of 4.0 eV or less and the oxide having relative permittivity of 10 or more into a dipole material having a lower dissociation energy and a higher dipole moment than those of LiF.

For example, without being bound by theory, it is believed that, when a voltage is applied to opposite ends of the electrode, a dipole material of an ion joining state in which positive charges and negative charges may be arranged in a dipole thin film (e.g., the electron injection layer in the present exemplary embodiment) according to an electric field. Electrons disposed at an interface between the electron transport layer 177 and the dipole thin film may be coupled to the dipole material of the dipole thin film, and holes disposed at an interface between the dipole thin film and the second electrode 180 that may serve as the cathode may be coupled to the dipole material of the dipole thin film. Many surplus electrons or holes as the offset amount for voltage maintenance may exist in the interface between the electron transport layer 177 and the dipole thin film or between the dipole thin film and the second electrode 180. A material like RbI included in the electron injection layer 179 according to the present exemplary embodiment may be a polar molecule having dipole moments without an electric field. The dipole moments may be present at a larger number, and electrons or holes to be coupled to the dipole material at the interface may exist at a larger number. Thus, a larger amount of electrons or holes may be present in the interface. For example, the interface of the organic electron transport layer 177 which may be positively charged by gathering holes may be represented as spaces at which electrons may be removed, which may indicate many empty spaces to which electrons may move. A vacuum level of the interface of the organic electron transport layer 177 may be shifted (a LUMO level may be decreased), and an injection barrier may be lowered. The metal having the work function of 4.0 eV or less may serve as a positively charged interface, for example, due to an electron donor characteristic, and the electron injection characteristic may be further improved.

Figure 3:
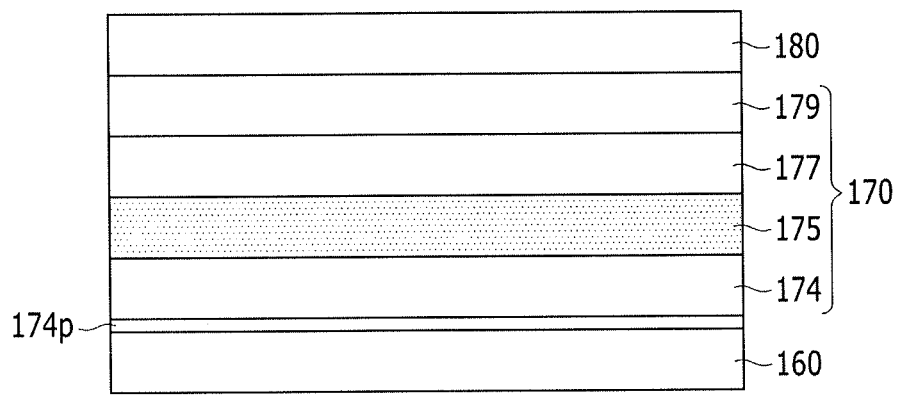
FIG. 3 illustrates a cross-sectional view of a modification of the organic light emitting diode shown in FIG. 2.

FIG. 3 illustrates a cross-sectional view of a modification of the organic light emitting diode shown in FIG. 2.

In the present exemplary embodiment, the thickness of the electron injection layer 179 may be adjusted in order to keep a balance between the electron injection characteristic improved by forming the electron injection layer 179 by use of a dipole material and the hole injection characteristic that may be relatively weakened. Table 4 shows results of measuring the driving voltage and the light efficiency that were changed by varying the thickness of the electron injection layer 179 made of RbI as 10 Å, 20 Å, 30 Å, 40 Å, and 50 Å. The Mg content of the cathode made of AgMg was about 20 volume %.

TABLE 4

|  | Driving voltage | Light efficiency |
| --- | --- | --- |
| RbI_10/AgMg, 20% | 4.1 | 153.3 |
| RbI_20/AgMg, 20% | 4.1 | 148 |
| RbI_30/AgMg, 20% | 4.2 | 142 |
| RbI_40/AgMg, 20% | 4.3 | 135 |
| RbI_50/AgMg, 20% | 4.5 | 110 |

RbI may serve as an inorganic dipole material or a dielectric material, and tunneling may be employed as the electron injection mechanism. As shown in Table 4, as the thickness of RbI is increased, electron tunneling may be reduced, the electron injection characteristic may be weakened, the charge balance may be broken, and an increase in the driving voltage and a decrease in the efficiency may be caused.

The hole transport region according to the present exemplary embodiment may further include charge generating materials to improve conductivity. These charge generating materials may be uniformly or non-uniformly dispersed in the hole transport region. In the present exemplary embodiment, the hole transport region may contact the first electrode 160, and the charge generating materials may be doped and deposed to be adjacent to an interface between the hole transport region and the first electrode 160. In the present exemplary embodiment, since the hole transport layer 174 contacts the first electrode 160, the charge generating materials may be formed to be adjacent to the interface between the hole transport layer 174 and the first electrode 160. Referring to FIG. 3, a doping layer 174p at which the charge generating materials are doped and deposited is disposed at a lower end portion of the hole transport layer 174 facing the first electrode 160. The content of a p-dopant included in the doping layer 174p according to the present exemplary embodiment may be equal to or smaller than about 4 volume %, for example, may be equal to or smaller than about 1 volume %.

The charge generating material according to the present exemplary embodiment may serve to improve charge balance between electrons and holes when the light efficiency is increased by the action of the electron injection layer including the dipole material.

In the present exemplary embodiment, the charge generating materials may be p-dopants, for example, the p-dopants may be, for example, one or more of a quinon derivative, a metal oxide, or a cyano group-containing compound.

Examples of the p-dopant may include one or more of a quinon derivative such, for example, as tetracyanoquinodimethan (TCNQ) or tetrafluoro-tetracyano-1,4-benzoquinondimethane (F4TCNQ) represented by Chemical Formula A, a metal oxide such as, for example, a tungsten oxide or a molybdenum oxide, or a compound represented by Chemical Formula B.

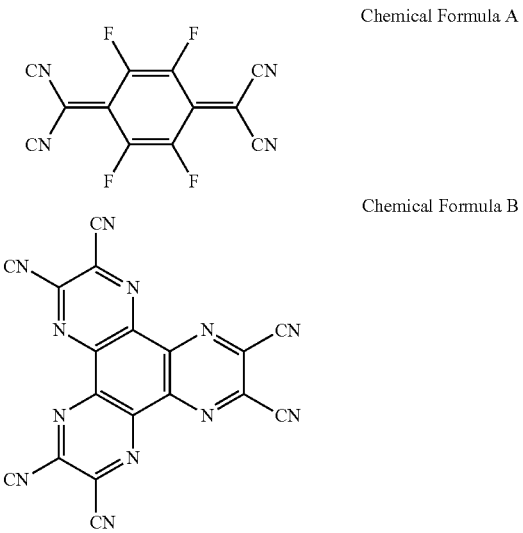

Chemical Formula A

Chemical Formula B

When the electron injection is significantly quickly performed in the electron transport region by forming the electron injection layer by use of a dipole material, recombination of the electrons and the holes may not be performed at the emission layer 175. Accordingly, the recombination of the electrons and the holes may be performed, and the efficiency may be reduced. In a front surface resonant structure of the organic light emitting diode, a thickness thereof in a red pixel area may be thickest, and the distance at which holes reach the emission layer 175 may be relatively longest. As a result, in the red pixel area, as the content of the p-dopants is increased, the balance of the holes which was not maintained, for example, due to a relatively small number thereof, may be restored, and the driving voltage and the efficiency may be improved as shown in Table 5.

TABLE 5

| P-dopant Content | Driving Voltage (V) | Light Efficiency |
| --- | --- | --- |
| p-dopant 1% | 5.5 | 21.6 |
| p-dopant 2% | 5.4 | 25.3 |
| p-dopant 3% | 4.6 | 50.2 |
| p-dopant 4% | 4.5 | 61.3 |
| p-dopant 5% | 5.3 | 23.2 |

The hole transport layer according to the present exemplary embodiment may further include one or more of a hole injection layer, a buffer layer, or an electron blocking layer as well as the hole transport layer. The hole injection layer may be formed on the hole transport layer. This will be described later in detail with reference to FIG. 7.

The buffer layer may serve to increase a light emission efficiency by compensating an optical resonance distance according to a wavelength of light emitted from the emission layer. Materials that may be included in the hole transport region may be employed as materials included in the buffer layer. The electron blocking layer may serve to prevent electron injection from an electron transport region which will be described later.

Figure 4:
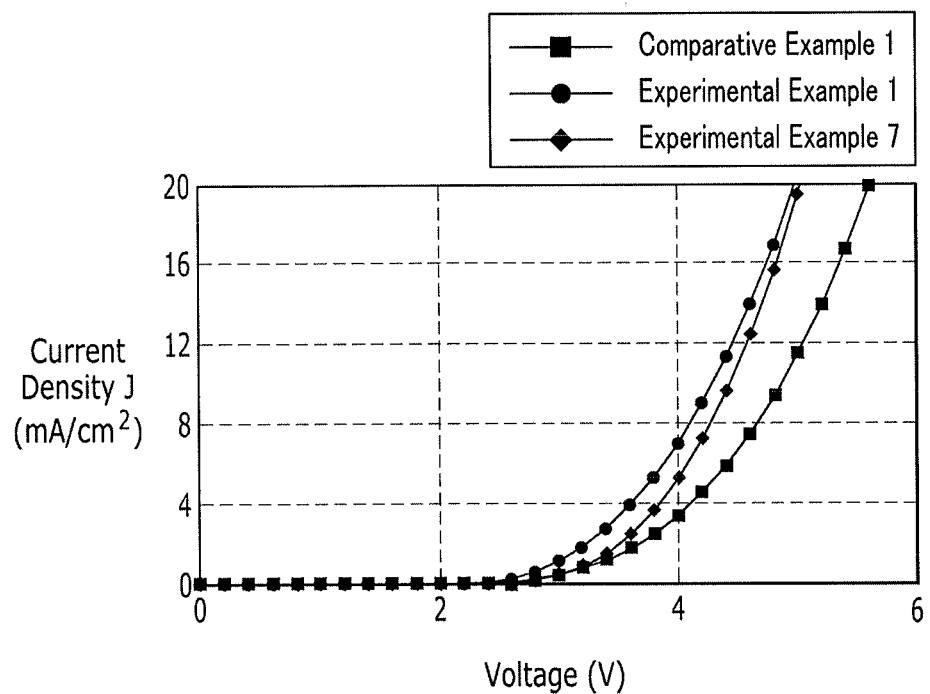
FIG. 4 to FIG. 6 illustrate graphs of a voltage-current density in each of a red pixel, a green pixel, and a blue pixel in the organic light emitting diode shown in FIG. 2.
Figure 5:
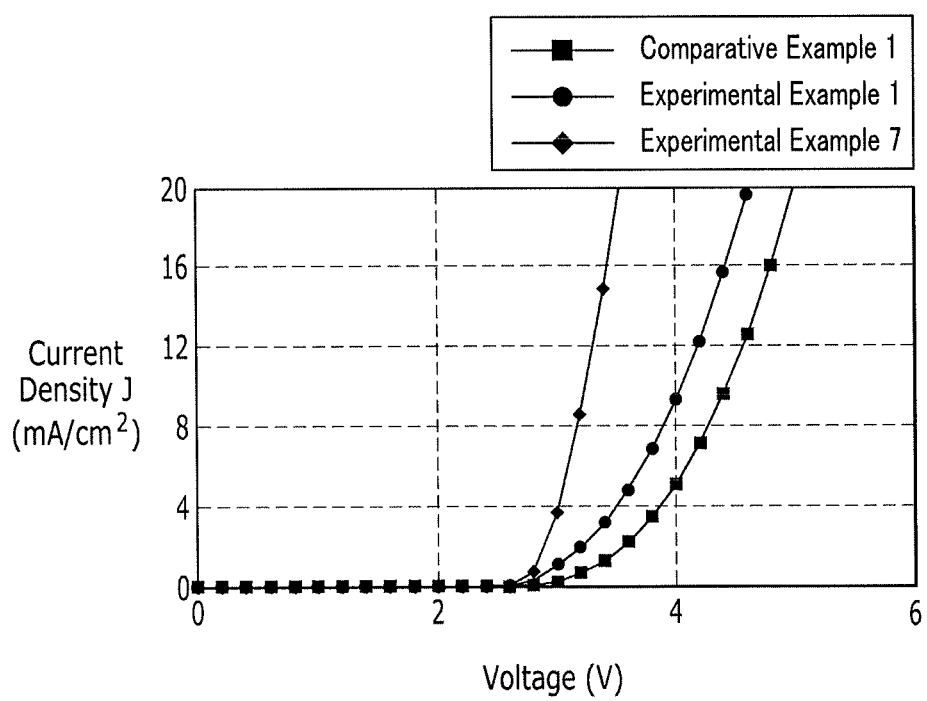
Figure 6:
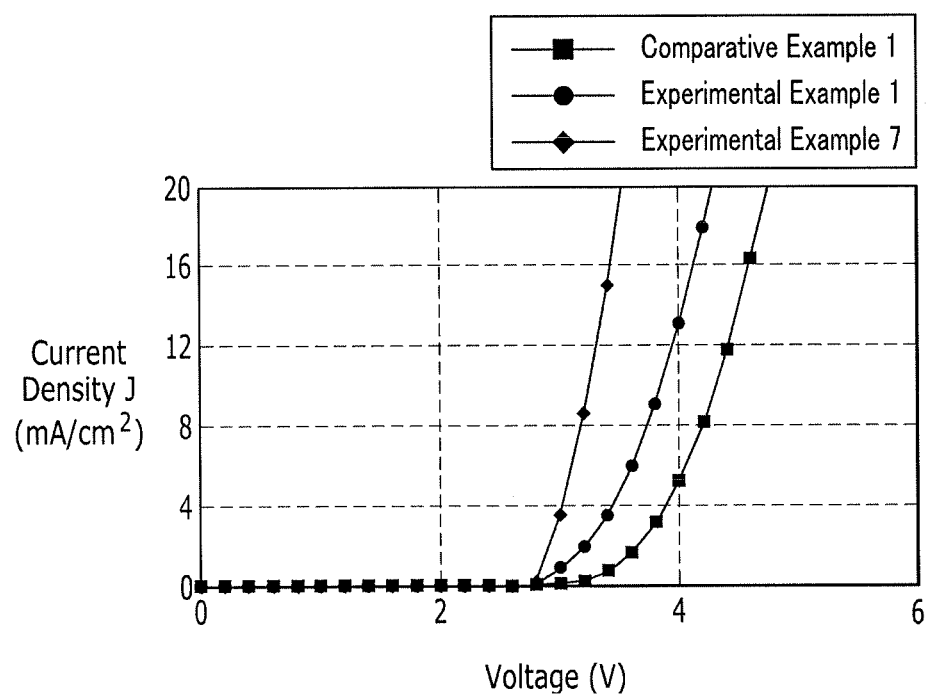

FIG. 4 to FIG. 6 illustrate graphs of a voltage-current density in each of a red pixel, a green pixel, and a blue pixel in the organic light emitting diode shown in FIG. 2.

In FIG. 4 to FIG. 6, in Comparative Experimental Example 1 the electron injection layer was made of Yb, in Experimental Example 1 the electron injection layer was made of RbI, and in Experimental Example 7 the electron injection layer was made of RbI.

Referring to FIG. 4 to FIG. 6, an electron injection rate was increased in Experimental Examples 1 and 7, in which the electron injection layer was made of RbI or RbI:Yb, from the point that Experimental Examples 1 and 2 show a low threshold voltage (Vth) and a steep inclination as compared with Comparative Experimental Example 1.

Figure 7:
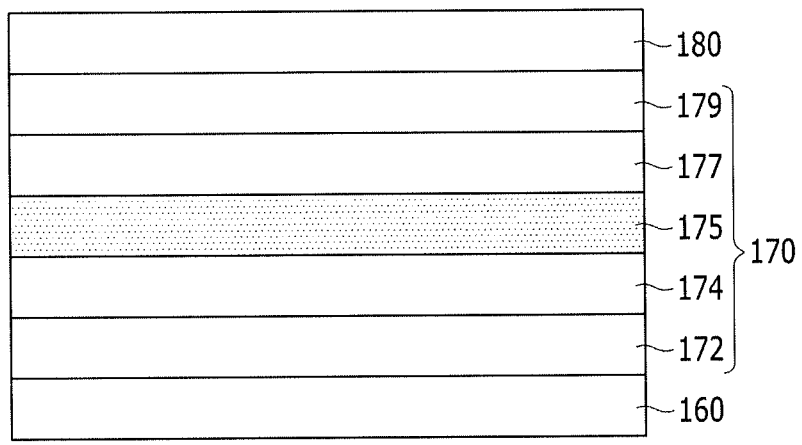
FIG. 7 illustrates a cross-sectional view of a modification of the organic light emitting diode shown in FIG. 2.

FIG. 7 illustrates a cross-sectional view of a modification of the organic light emitting diode shown in FIG. 2;

For example, FIG. 7 illustrates a structure in which a hole injection layer 172 may be added into the hole transport region of the organic light emitting diode LD in the exemplary embodiment of FIG. 2. In the present exemplary embodiment, the hole injection layer 172 may be disposed between the hole transport layer 174 and the first electrode 160. The hole injection layer 172 may facilitate easier injection of holes from the first electrode 160 to the hole transport layer 174. In the present exemplary embodiment, the hole injection layer 172 may include a dipole material in which a metal or a non-metal having a work function of 4.3 eV or more and a halogen may be combined. In an embodiment, the hole injection layer 172 may be formed of an inorganic material or an organic material.

The metal or the non-metal having the work function of 4.3 eV or more may include one or more of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, or Zn.

Figure 8:
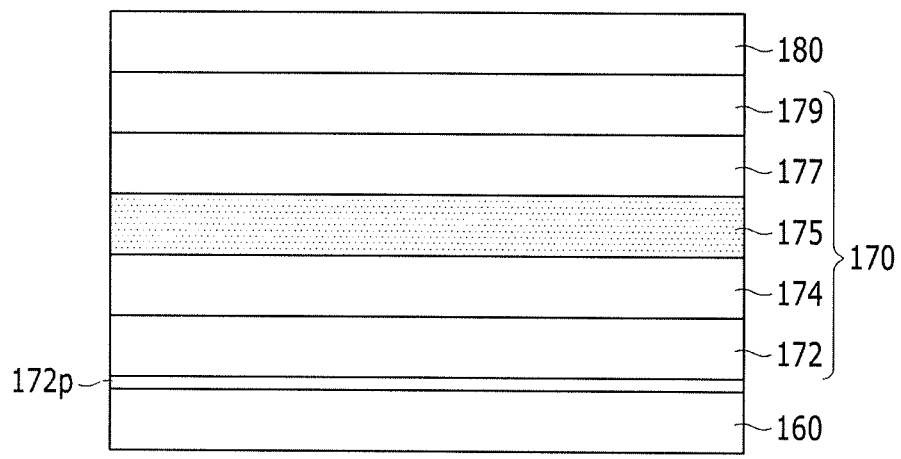
FIG. 8 illustrates a cross-sectional view of a modification of the organic light emitting diode shown in FIG. 7.

The description made with reference to FIG. 2 other than the aforementioned difference is applicable to the modification of FIG. 7. FIG. 8 illustrates a cross-sectional view of a modification of the organic light emitting diode shown in FIG. 7.

The hole transport region according to the present exemplary embodiment may further include charge generating materials to improve conductivity. These charge generating materials may be uniformly or non-uniformly dispersed in the hole transport region. In the present exemplary embodiment, the hole transport region may contact the first electrode 160, and the charge generating materials may be doped and deposed to be adjacent to an interface between the hole transport region and the first electrode 160. In the present exemplary embodiment, since the hole transport layer 174 contacts the first electrode 160, the charge generating materials may be formed to be adjacent to the interface between the hole transport layer 172 and the first electrode 160. Referring to FIG. 3, a doping layer 172p at which the charge generating materials are doped and deposed is disposed at a lower end portion of the hole transport layer 172 facing the first electrode 160. The content of a p-dopant included in the doping layer 172p according to the present exemplary embodiment may be equal to or smaller than about 4 volume %, for example, may be equal to or smaller than about 1 volume %.

The charge generating material according to the present exemplary embodiment may serve to improve charge balance between electrons and holes when the light efficiency is increased by the action of the aforementioned electron injection layer including the dipole material.

Examples of the charge generating materials according to the present exemplary embodiment may be the same as those described in the exemplary embodiment of FIG. 3.

As described above, the hole transport layer according to the present exemplary embodiment may further include one or more of a hole injection layer, a buffer layer, or an electron blocking layer as well as the hole transport layer.

The buffer layer may serve to increase a light emission efficiency by compensating an optical resonance distance according to a wavelength of light emitted from the emission layer. Materials that may be included in the hole transport region may be employed as materials included in the buffer layer. The electron blocking layer may serve to prevent electron injection from an electron transport region which will be described later FIG. 9 illustrates a cross-sectional view of a modification of the organic light emitting diode shown in FIG. 2.

Figure 9:
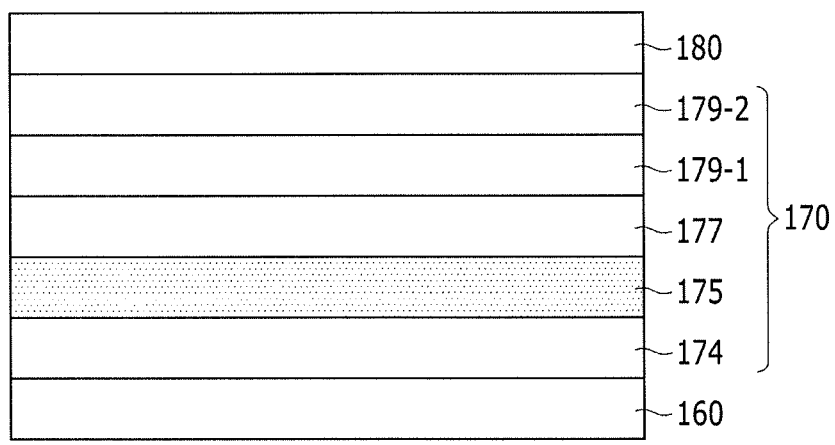
FIG. 9 illustrates a cross-sectional view of a modification of the organic light emitting diode shown in FIG. 2.

For example, FIG. 9 illustrates the same structure as that of the organic light emitting diode LD in the exemplary embodiment of FIG. 2, except that the electron injection layer 179 may be formed to have two layers. In the present exemplary embodiment, the electron injection layer 179 may include a first electron injection layer 179-1 and a second electron injection layer 179-2. Each of the first electron injection layer 179-1 and the second electron injection layer 179-2 may be formed by using at least one of a dipole material having a first component and a second component which have different polarities, a metal having a work function of 4.0 eV or less, and an oxide having relative permittivity of 10 or more, or by co-deposition of these materials. The first electron injection layer 179-1 and the second electron injection layer 179-2 may be formed of the same material, or may include different materials.

The description made with reference to FIG. 2 other than the aforementioned difference is applicable to the modification of FIG. 9.

Figure 10:
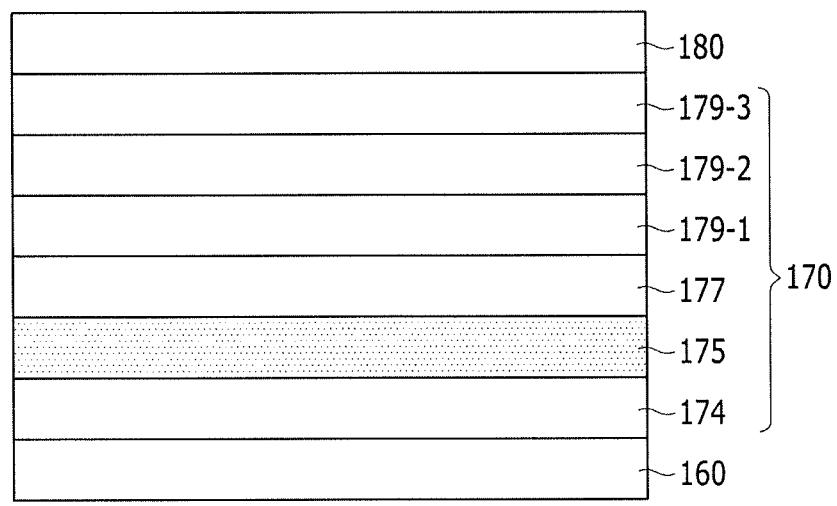
FIG. 10 illustrates a cross-sectional view of a modification of the organic light emitting diode shown in FIG. 2.

FIG. 10 illustrates a cross-sectional view of a modification of the organic light emitting diode shown in FIG. 2.

For example, FIG. 10 illustrates the same structure as that of the organic light emitting diode LD in the exemplary embodiment of FIG. 2, except that the electron injection layer 179 may be formed to have three layers. In the present exemplary embodiment, the electron injection layer 179 may include a first electron injection layer 179-1, a second electron injection layer 179-2, and a third electron injection layer 179-3. Each of the first electron injection layer 179-1, the second electron injection layer 179-2, and the third electron injection layer 179-3 may be formed by using at least one of a dipole material having a first component and a second component which have different polarities, a metal having a work function of 4.0 eV or less, and an oxide having relative permittivity of 10 or more, or by co-deposition of at least two of these materials. The first electron injection layer 179-1, the second electron injection layer 179-2, and the third electron injection layer 179-3 may be formed of the same material, or may include different materials.

The description made with reference to FIG. 2 other than the aforementioned difference is applicable to the modification of FIG. 8.

Figure 11:
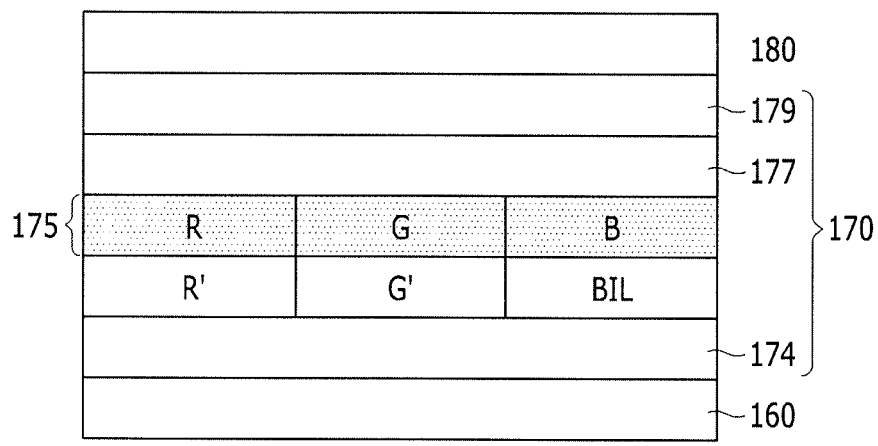
FIG. 11 illustrates a cross-sectional view of a modification of the organic light emitting diode shown in FIG. 2.

FIG. 11 illustrates a cross-sectional view of a modification of the organic light emitting diode shown in FIG. 2.

For example, FIG. 11 illustrates a modification of the emission layer 175 in the organic light emitting diode LD of FIG. 2. In the present exemplary embodiment, the emission layer 175 may include a red emission layer R, a green emission layer G, a blue emission layer B, and an auxiliary layer BIL for increasing efficiency of the blue light emitting layer B disposed at a lower end thereof.

The thickness of the red light emitting layer R may be in a range of from about 30 nm to about 50 nm, the thickness of the green light emitting layer G may be in a range of from about 10 nm to about 30 nm, and thickness of the blue light emitting layer B may be in a range of from about 10 nm to about 30 nm. The thickness of the auxiliary layer BIL may be about 20 nm. The auxiliary layer BIL may serve to adjust a hole charge balance, and may improve the efficiency of the blue light emitting layer B. The auxiliary layer BIL may contain a compound that is represented by the following Chemical Formula 1.

Chemical Formula 1

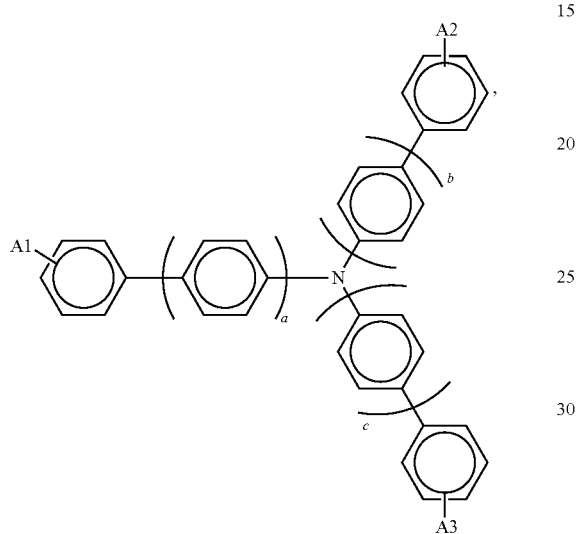

In Chemical Formula 1, each of "A1," "A2," and "A3" may be an alkyl group, an aryl group, carbazole, dibenzothiophene, dibenzofuran (DBF), or biphenyl, and each of "a," "b," and "c" may be an integer in a range of from 0 to 4.

Examples of compounds represented by the chemical formula 1 may include the following Chemical Formulae 1-1, 1-2, 1-3, 1-4, 1-5, and 1-6.

Chemical Formula 1-1

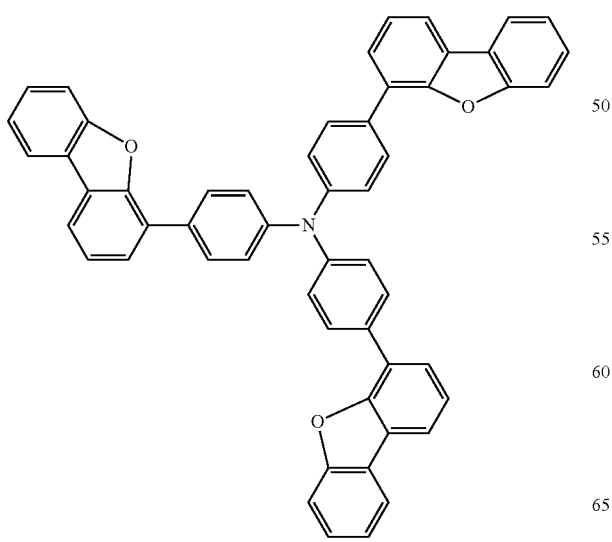

Chemical Formula 1-2

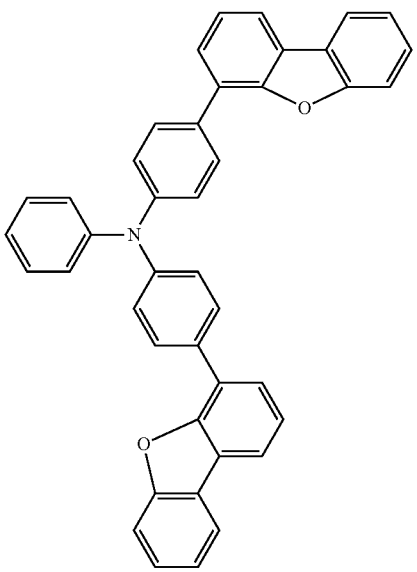

Chemical Formula 1-3

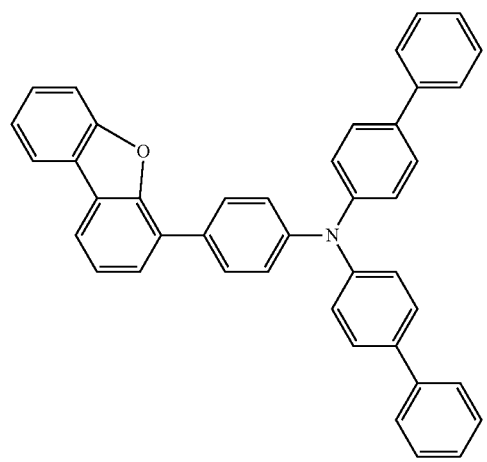

Chemical Formula 1-4

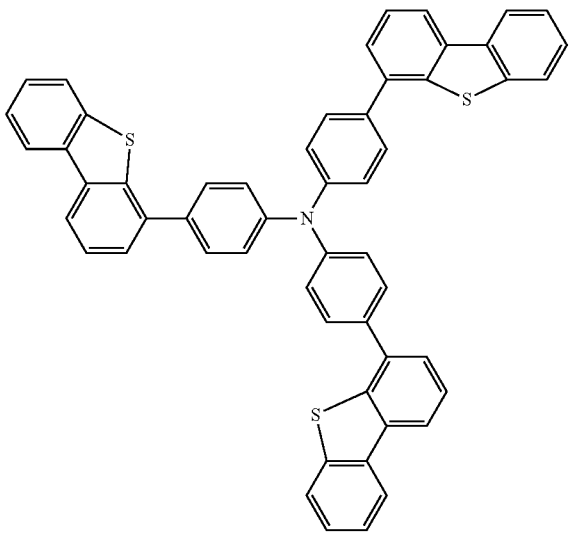

Chemical Formula 1-5

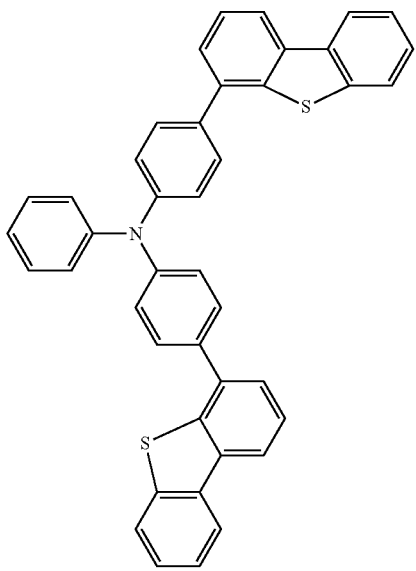

Chemical Formula 1-6

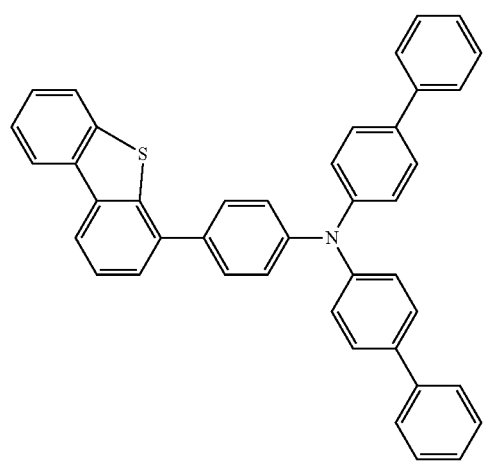

According to an exemplary embodiment, the auxiliary layer BIL may contain a compound that is represented by the following Chemical Formula 2.

Chemical Formula 2

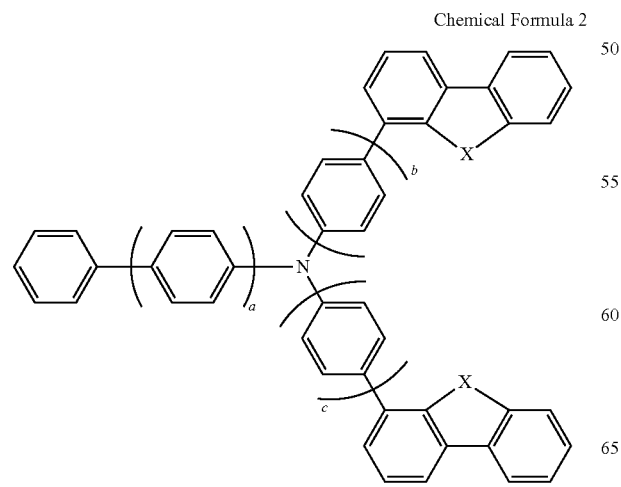

In Chemical Formula 2, each of "a," "b," and "c" may be an integer in a range of from 0 to 3, "X" may be selected from O, N, and S, and the elements selected for X may be the same as or different from each other.

Examples of compounds represented by Chemical Formula 2 may include the following Chemical Formulae 2-1 to 2-6.

Chemical Formula 2-1

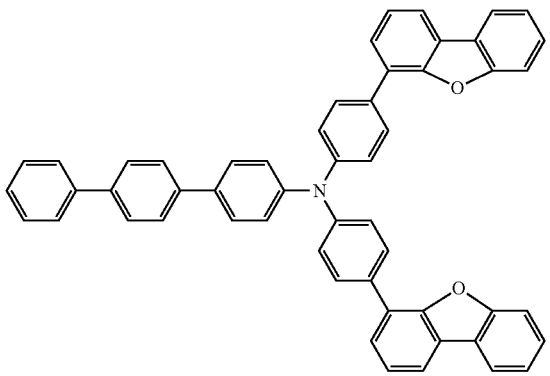

Chemical Formula 2-2

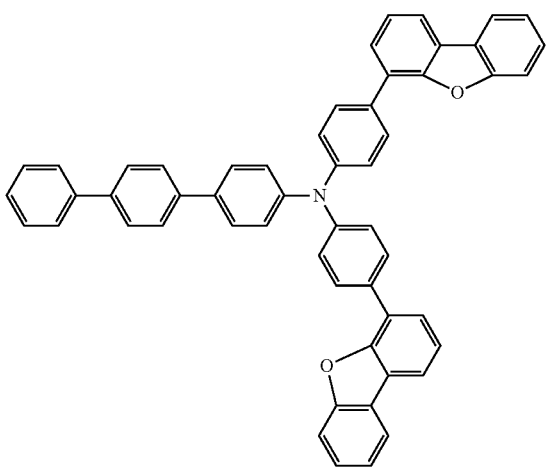

Chemical Formula 2-3

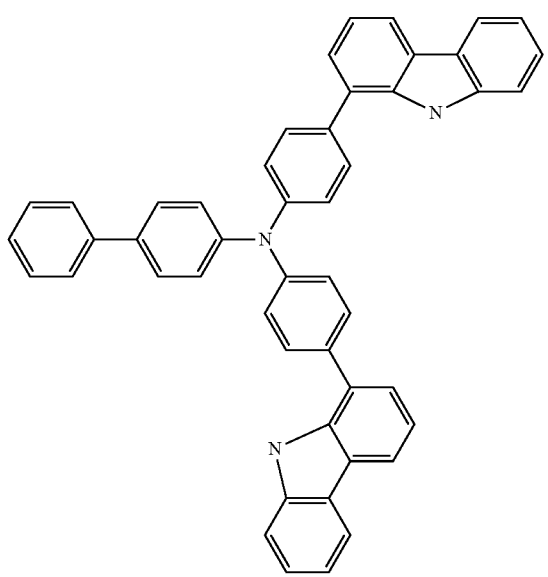

Chemical Formula 2-4

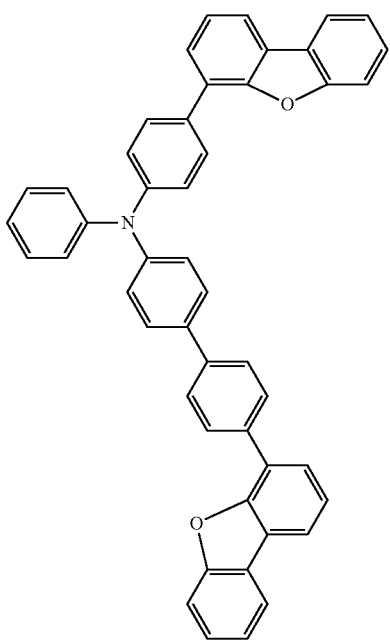

Chemical Formula 2-5

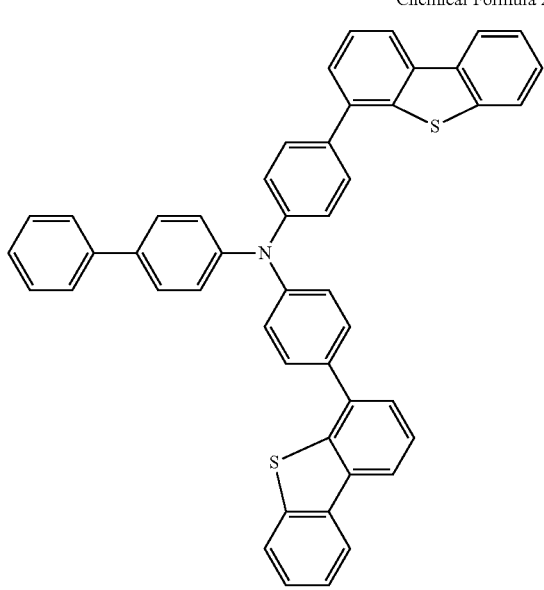

Chemical Formula 2-6

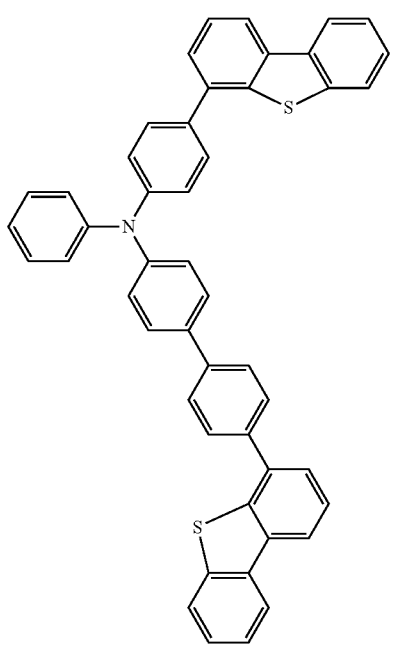

According to an exemplary embodiment, the auxiliary layer BIL may contain a compound that is represented by the following Chemical Formula 3.

Chemical Formula 3

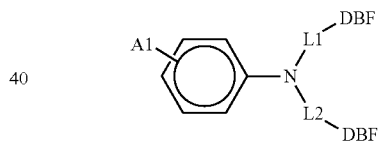

In Chemical Formula 3, "A1" may be an alkyl group, an aryl group, carbazole, dibenzothiophene, or dibenzofuran (DBF), and each of L1 and L2 may be

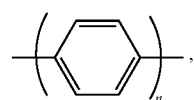

n being an integral in a range of from 0 to 3. The DBF connected to L1 and L2 may be substituted with carbazole or dibenzothiophene.

Hereinafter, a synthesis method of the auxiliary layer BIL according to an exemplary embodiment will be described. As one example, the synthesis method of Chemical Formula 1-1 will be described.

Chemical Formula 1-1

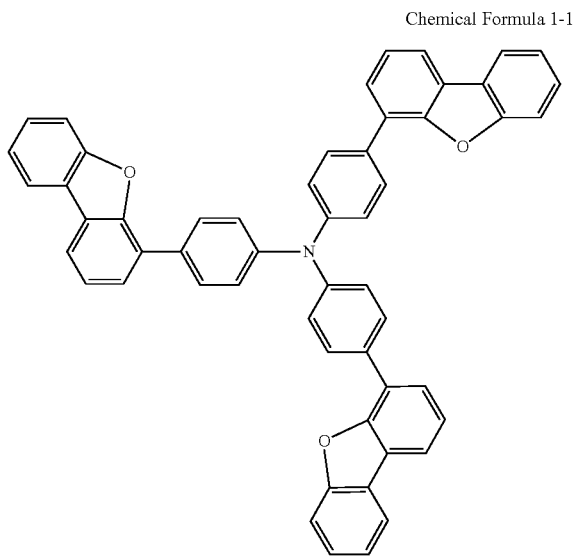 [SMILES: c1ccc2c(c1)oc1c(-c3ccc(N(c4ccc(-c5cccc6c5oc5ccccc56)cc4)c4ccc(-c5cccc6c5oc5ccccc56)cc4)cc3)cccc12]

SYNTHESIS EXAMPLE

Under an argon atmosphere, 6.3 g of 4-dibenzofuranboronic acid, 4.8 g of 4, 4', 4"-tribromotriphenylamine, 104 mg of tetrakis(triphenylphosphine)palladium (Pd(PPh$_3$)$_4$), 48 ml of a 2M solution of sodium carbonate (Na$_2$CO$_3$), and 48 ml of toluene were put into a 300 ml three-neck flask, and then they were reacted at a temperature of 80° C. for 8 hours. The reaction liquid was extracted by using toluene and water, and the extract was dried by using sodium sulfate anhydrous. The resultant mixture was concentrated under a reduced pressure, and a crude product obtained was refined through a column purifying process, thereby obtaining 3.9 g of a whitish yellow powder.

In FIG. 11, a red resonance auxiliary layer R' may be disposed below the red light emission layer R, and a green resonance auxiliary layer G' may be disposed below the green light emission layer G. The red resonance auxiliary layer R' and the green resonance auxiliary layer G' are layers that set a resonant distance (a resonance distance) for a respective one of the colors (e.g., red or green). In some embodiments, a blue resonance auxiliary layer is not included. For example, a separate resonance auxiliary layer disposed between the hole transport layer 174 and the blue light emission layer B and the auxiliary layer BIL may not be formed below the blue light emission layer B and the auxiliary layer BIL corresponding to the red light emission layer R or the green light emission layer G. In some embodiments, the auxiliary layer BIL physically may contact the hole transport layer 174.

Although not shown in FIG. 11, the hole injection layer 172 may be formed between the first electrode 160 and the hole transport layer 174 as in the exemplary embodiment described with reference to FIG. 7.

The description made with reference to FIG. 2 other than the aforementioned difference is applicable to the modification of FIG. 11.

By way of summation and review, an organic light emitting display device as a display device may have a wide viewing angle, outstanding contrast, and a fast response time. The organic light emitting display device may include an organic light emitting diode for emitting light, and, in the organic light emitting diode device, electrons injected from one electrode and holes injected from another electrode may be combined with each other in an emission layer, excitons may be generated, energy may be outputted from the excitons, and light may be emitted.

Provided are an organic light emitting diode and an organic light emitting display device including the same, which may exhibit high efficiency and a long lifespan. According to an exemplary embodiment, it may be possible to increase light emitting efficiency by forming the electron injection layer including a dipole material. According to an exemplary embodiment, it may be possible to increase light emitting efficiency of the blue emission layer by forming an auxiliary layer below the blue emission layer.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode, comprising:
a first electrode;
a second electrode facing the first electrode, the second electrode including magnesium;
an emission layer between the first electrode and the second electrode; and
an electron injection layer between the second electrode and the emission layer,
the electron injection layer including a dipole material and Yb,
the dipole material including one or more of LiI, NaI, KI, RbI, CsI, or FrI, and
a content of the magnesium included in the second electrode being in a range of from 10 to 30 volume %.

2. The organic light emitting diode as claimed in claim 1, further comprising:
an electron transport layer between the emission layer and the electron injection layer; and
a hole transport layer between the emission layer and the first electrode,
wherein each of the hole transport layer and the electron transport layer includes an organic material.

3. The organic light emitting diode as claimed in claim 1, wherein:
the emission layer includes a red light emitting layer, a green light emitting layer, and a blue light emitting layer, and
the emission layer further includes an auxiliary layer at a lower end of the blue light emitting layer.

4. The organic light emitting diode as claimed in claim 3, further comprising:
a red auxiliary layer at a lower end of the red light emitting layer, and
a green auxiliary layer at a lower end layer of the green light emission layer.

5. The organic light emitting diode as claimed in claim 3, wherein the auxiliary layer includes a compound represented by Chemical Formula 1:

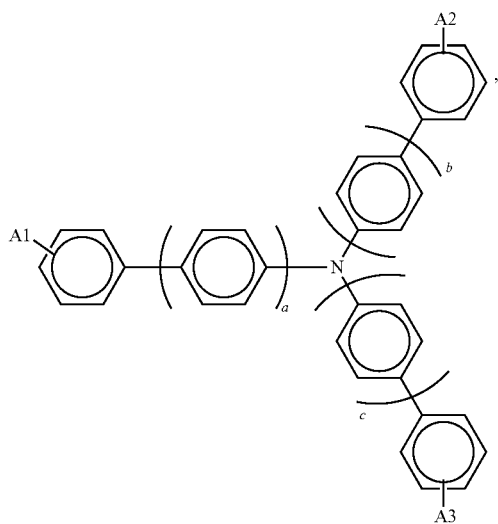

wherein each of "A1," "A2," and "A3" is an alkyl group, an aryl group, carbazole, dibenzothiophene, dibenzofuran (DBF), or biphenyl, and each of "a," "b," and "c" is an integer in a range of from 0 and 4.

6. The organic light emitting diode as claimed in claim 3, wherein the auxiliary layer includes a compound represented by Chemical Formula 2:

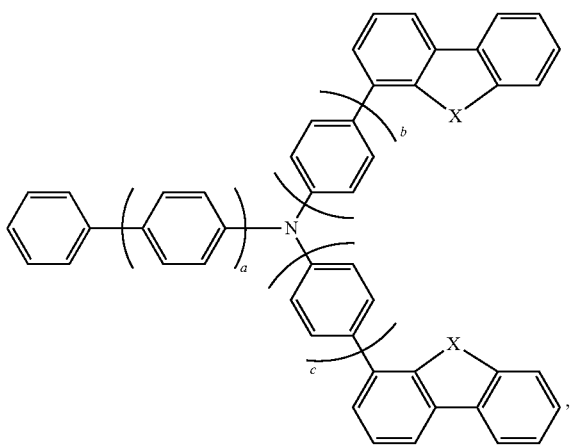

wherein each of "a," "b," and "c" is an integer in a range of from 0 to 3, "X" is selected from O, N, and S, and the elements selected for X are the same as or different from each other.

7. An organic light emitting diode, comprising:
a first electrode;
a second electrode facing the first electrode;
an emission layer between the first electrode and the second electrode;
a hole transport region between the first electrode and the second electrode; and
an electron injection layer between the second electrode and the emission layer,
wherein:
the electron injection layer includes a dipole material and Yb,
the dipole material includes one or more of LiI, NaI, KI, RbI, CsI, or FrI,
the hole transport region includes a doping layer including a charge generating material.

8. The organic light emitting diode as claimed in claim 7, wherein:
the second electrode includes silver (Ag)-magnesium (Mg), and
a thickness of the second electrode is in a range of from 50 to 150 Å.

9. The organic light emitting diode as claimed in claim 7, wherein the electron injection layer is formed by co-depositing a dipole material including one of LiI, NaI, KI, RbI, CsI, and FrI, and ytterbium (Yb).

10. The organic light emitting diode as claimed in claim 9, wherein:
the electron injection layer further includes an oxide having relative permittivity of 10 or more, and
the electron injection layer is formed by co-depositing two or more of the dipole material, the metal having the work function of 4.0 eV or less, and the oxide having relative permittivity of 10 or more.

11. The organic light emitting diode as claimed in claim 7, wherein the doping layer is adjacent to an interface between the first electrode and the hole transport region.

12. The organic light emitting diode as claimed in claim 11, wherein the charge generating material includes a p-dopant.

13. The organic light emitting diode as claimed in claim 12, wherein the p-dopant includes one or more of a quinone derivative, a metal oxide, or a cyano group-containing compound.

14. The organic light emitting diode as claimed in claim 13, wherein:
the hole transport region includes one or more of a hole injection layer or a hole transport layer, and
a content of the p-dopant included in the doping layer is in a range of 4 volume % or less.

15. The organic light emitting diode as claimed in claim 14, wherein:
the second electrode includes silver-magnesium.

16. The organic light emitting diode as claimed in claim 15, wherein a content of magnesium included in the second electrode is in a range of from 10 to 40 volume %.

17. The organic light emitting diode as claimed in claim 7, wherein the electron injection layer is formed by co-depositing a dipole material including one of LiI, NaI, KI, RbI, CsI, FrI, and ytterbium (Yb).

* * * * *